United States Patent
Boozer et al.

(10) Patent No.: US 10,045,461 B1
(45) Date of Patent: Aug. 7, 2018

(54) ELECTRONIC DEVICE WITH DIAPHRAGM COOLING

(71) Applicant: Apple Inc., Cupertino, CA (US)

(72) Inventors: Brad G. Boozer, Saratoga, CA (US); Craig M. Stanley, Campbell, CA (US); John J. Baker, Cupertino, CA (US); Phillip Michael Hobson, Menlo Park, CA (US); Nathan P. Bosscher, Campbell, CA (US)

(73) Assignee: Apple Inc., Cupertino, CA (US)

( * ) Notice: Subject to any disclaimer, the term of this patent is extended or adjusted under 35 U.S.C. 154(b) by 42 days.

(21) Appl. No.: 14/720,169

(22) Filed: May 22, 2015

Related U.S. Application Data

(60) Provisional application No. 62/057,645, filed on Sep. 30, 2014.

(51) Int. Cl.
| | |
|---|---|
| *H05K 7/20* | (2006.01) |
| *H04R 3/00* | (2006.01) |
| *H04R 1/00* | (2006.01) |

(52) U.S. Cl.
CPC ........... *H05K 7/20145* (2013.01); *H04R 1/00* (2013.01); *H04R 3/007* (2013.01)

(58) Field of Classification Search
CPC .... H04R 9/022; H04R 1/028; H04R 2400/00; H04R 29/001; H04R 9/06; H04R 1/00; H04R 3/007; G06F 1/203; G06F 1/206; G06F 3/165; H05K 7/20136; H05K 7/20145
See application file for complete search history.

(56) References Cited

U.S. PATENT DOCUMENTS

| | | | | |
|---|---|---|---|---|
| 3,688,864 | A * | 9/1972 | Guss ........................ | H04R 1/26 181/145 |
| 3,778,551 | A * | 12/1973 | Grodinsky ............. | H05K 7/209 361/693 |
| 4,783,820 | A * | 11/1988 | Lyngdorf ............... | H04R 1/227 181/145 |
| 4,875,546 | A * | 10/1989 | Krnan ...................... | H04R 5/02 181/144 |

(Continued)

FOREIGN PATENT DOCUMENTS

JP  5199575  8/1993

*Primary Examiner* — James Wu
*Assistant Examiner* — Michael Matey
(74) *Attorney, Agent, or Firm* — Kilpatrick Townsend & Stockton LLP

(57) ABSTRACT

An electronic device may be provided with electrical components such as a power supply that produce heat. Speakers and other components may be controlled using control circuitry within the electronic device. The electronic device may play audio signals through the speakers. Audio data may be received from external equipment or may be maintained locally within the device. A speaker such as a subwoofer may be mounted in a device housing above the power supply so that airflow from the speaker cools the power supply. To enhance cooling, the control circuitry may supply inaudible signals to the speaker that enhance airflow produced by the speaker. The inaudible signals may be supplied in response to detecting current heat-producing audio playback conditions, to predicting future heat-producing conditions, or real-time temperature measurements.

26 Claims, 13 Drawing Sheets

(56) References Cited

U.S. PATENT DOCUMENTS

| | | | | |
|---|---|---|---|---|
| 5,073,945 A * | 12/1991 | Kageyama | ............ | H04R 1/227 381/184 |
| 5,533,132 A * | 7/1996 | Button | ................... | H04R 1/028 181/199 |
| 5,850,460 A * | 12/1998 | Tanaka | ................ | H04R 1/2873 381/182 |
| 5,914,856 A * | 6/1999 | Morton | ............. | H05K 7/20172 165/165 |
| 6,252,769 B1 * | 6/2001 | Tullstedt | ............... | F04B 35/045 174/15.1 |
| 6,678,384 B2 * | 1/2004 | Kowaki | ............... | H04R 1/2896 181/144 |
| 6,678,387 B2 | 1/2004 | Kemmerer | | |
| 6,771,791 B2 | 8/2004 | Shelley et al. | | |
| 7,553,135 B2 * | 6/2009 | Cho | ..................... | F04B 43/046 361/688 |
| 8,081,454 B2 * | 12/2011 | Ishikawa | .................. | F04F 7/00 165/122 |
| 8,189,841 B2 * | 5/2012 | Litovsky | .............. | H04R 1/2834 381/182 |
| 8,553,914 B2 * | 10/2013 | Fletcher | ................... | H04R 5/02 381/300 |
| 8,699,737 B2 * | 4/2014 | Mamin | ................ | H04R 1/2819 381/337 |
| 9,351,059 B1 * | 5/2016 | Suhre | .................... | H04R 1/025 |
| 2002/0076062 A1 * | 6/2002 | Juszkiewicz | ......... | H04R 1/2842 381/89 |
| 2003/0053644 A1 * | 3/2003 | Vandersteen | ............ | H04R 1/26 381/182 |
| 2004/0017924 A1 * | 1/2004 | Kuratani | .................. | H04R 1/02 381/349 |
| 2004/0196999 A1 * | 10/2004 | Han | ..................... | H04R 1/2819 381/345 |
| 2005/0169494 A1 * | 8/2005 | Stiles | ....................... | H04R 1/02 381/337 |
| 2005/0211498 A1 * | 9/2005 | Osada | .................. | H04R 1/2819 181/156 |
| 2009/0245563 A1 * | 10/2009 | Parker | .................... | H04R 9/022 381/345 |
| 2015/0085441 A1 * | 3/2015 | Reilly | ..................... | G06F 1/203 361/679.46 |
| 2015/0109732 A1 * | 4/2015 | Akif | ..................... | F04B 43/046 361/694 |
| 2015/0173237 A1 * | 6/2015 | Lin | ..................... | H05K 7/20009 361/690 |
| 2016/0025429 A1 * | 1/2016 | Muir | ..................... | F04B 45/047 165/120 |

* cited by examiner

ELECTRONIC DEVICE WITH DIAPHRAGM COOLING

This application claims the benefit of provisional patent application No. 62/057,645, filed Sep. 30, 2014, which is hereby incorporated by reference herein in its entirety.

BACKGROUND

This relates generally to electronic devices, and, more particularly, to managing heat produced by electrical components in electronic devices.

Electronic devices include electrical components such as integrated circuits, and other circuitry. This circuitry may be used in forming communications circuits, control circuits, power supplies, and other circuits within an electronic device. During operation, the circuitry of an electronic device produces heat. Excess heat can damage device components, so the heat that is produced by the circuitry should be removed from the device.

It can be challenging to design a cooling system for an electronic device. Some cooling systems produce undesirable levels of noise. Noise can interfere with the use of the electronic device. Other cooling systems may produce insufficient amounts of cooling. When a device is cooled insufficiently, there is a risk that parts may overheat and cause damage.

It would therefore be desirable to be able to provide improved cooling techniques for electronic devices that include heat producing components.

SUMMARY

An electronic device may be provided with electrical components that produce heat during operation. The electrical components may include a power supply for the electronic device.

The electronic device may have a housing in which electrical components are mounted. For example, an array of electrical components may be mounted in openings on housing sidewalls. Speakers such as subwoofers may be mounted at the upper and lower ends of the housing or elsewhere within the device.

Speakers and other components in the electronic device may be controlled using control circuitry within the electronic device. The control circuitry may play audio signals through the speakers. Audio data may be received from external equipment or may be obtained locally within the device.

A speaker such as a subwoofer may be mounted in the housing above a heat-producing component such as a power supply so that airflow from the speaker can cool the component. To enhance cooling, the control circuitry may supply signals to the speaker that enhance airflow produced by the speaker. The signals may be inaudible or nearly inaudible to a user. The inaudible or nearly inaudible signals may be supplied in response to detecting current heat-producing audio playback conditions, to predicting future heat-producing conditions, or real-time temperature measurements.

Airflow biasing structures may be provided to encourage air to flow in a desired direction during movement of the speaker. The airflow biasing structures may cause more airflow to be directed into air entrance openings and out of air exit openings than flows out of air entrance openings and into air exit openings. Establishing airflow in a desired direction through the housing may help efficiently cool hot components with cool air entering the housing while exhausting corresponding heated air.

DETAILED DESCRIPTION

An electronic device may have electrical components that produce heat during operation. The electronic device may have a cooling system that uses one or more speakers to move air and thereby help cool the components. Speakers can move air when playing audio content during normal operation and can move air when driven using subaudible frequencies.

If desired, cooling operations may be regulated dynamically based on temperature measurements or based on information on current or future thermal loads. Thermal load predictions may be made, for example, by analyzing digital audio content before or during the playback of audio content for a user. In some situations, an electronic device may receive audio to be played back from external equipment. Electronic devices may also play locally stored audio content.

Figure 1:
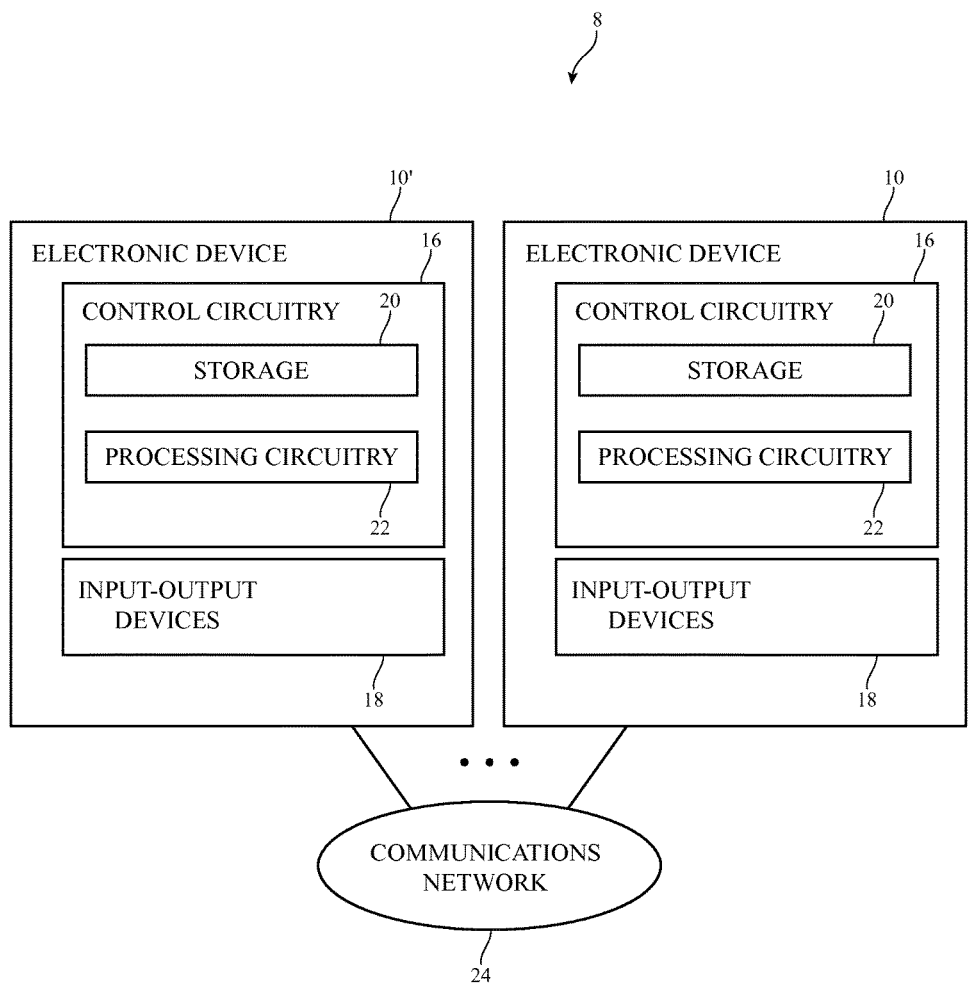
FIG. 1 is a schematic diagram of an illustrative system in accordance with an embodiment.

An illustrative system that includes electronic devices is shown in FIG. 1. As shown in FIG. 1, system 8 may include one or more electronic devices such as electronic device 10. Device 10 may include one or more speakers and may play audio content for a user. External equipment (see, e.g., electronic device 10') may, if desired, provide electronic device 10 with data. For example, electronic device 10' may provide audio data to device 10 that device 10 plays to a user. The audio data may be accompanied by corresponding video content or may be a music file or other audio content that is not accompanied by video information.

Electronic device 10 (and/or device 10') may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a stand-alone speaker, a speaker implemented as part of other equipment, equipment that implements the functionality of two or more of these devices, or other electronic equipment.

As shown in FIG. 1, electronic device 10 (and device 10') may have control circuitry 16. Control circuitry 16 may include storage 20 and may have processing circuitry 22 for supporting the operation of device 10. Storage 20 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry 22 may be used to control the operation of device 10. The processing circuitry may be based on one or more microprocessors, microcontrollers, digital signal processors, baseband processors and other wireless communications circuits, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors such as touch sensors, proximity sensors, ambient light sensors, compasses, gyroscopes, accelerometers, light-emitting diodes and other status indicators, data ports, etc. A user can control the operation of device 10 by supplying commands through input-output devices 18 and may receive status information and other output from device 10 using the output resources of input-output devices 18. If desired, a user may control the operation of device 10 using input-output devices 18 and other resources in device 10'. As an example, device 10 may be an accessory such as a speaker or other output device with a speaker and device 10' may be a host device such as a computer, cellular telephone, or set-top box. In this type of scenario, a user may interact with device 10 by supplying commands and other input to device 10'. Arrangements in which a user interacts with both device 10 and 10' may also be used (e.g., to allow a user to make a volume adjustment or other audio content playback adjustment using input-output resources associated with device 10 and/or on device 10').

Input-output devices 18 may include one or more displays. Device 10 (or device 10') may, for example, include a touch screen display that includes a touch sensor for gathering touch input from a user or a display that is insensitive to touch. A touch sensor for a display in device 10 or device 10' may be based on an array of capacitive touch sensor electrodes, acoustic touch sensor structures, resistive touch components, force-based touch sensor structures, a light-based touch sensor, or other suitable touch sensor arrangements.

Power for device 10 (and device 10') may be provided by an external source of power and/or an internal battery. The components for devices 10 and 10' such as circuitry 16 and devices 18 and other structures may be implemented using integrated circuits, discrete components (e.g., resistors, capacitors, and inductors), microelectromechanical systems (MEMS) devices, portions of housing structures, packaged parts, and other devices and structures. If desired, some of these components may be omitted (e.g., to simplify either device 10' or device 10). For example, device 10' may include a display and device 10 may not include a display, etc.

Control circuitry 16 may be used to run software on devices 10 and 10' such as operating system code and applications. During operation of devices in system 8 such as devices 10 and 10', the software running on control circuitry 16 may display images for a user on an optional display and may use other internal components such as input-output devices 18. For example, electronic device circuitry such as audio circuits may be used to play audio through one or more speakers in device 10 (or 10'). Devices 10 and 10' may use communications circuits to send and receive wireless and wired data over a communications link within communications network 24. Devices 10 and 10' may, for example, use wireless circuits in circuitry 16 (e.g., a baseband processor and associated radio-frequency transceiver circuitry) to transmit and receive wireless signals. Devices 10 and 10' may transmit and receive cellular telephone signals and/or wireless local area network signals or other wireless data (e.g., Bluetooth® data, wireless data shared over an IEEE 802.11 link, etc.). As an example, device 10' may wirelessly stream audio content to device 10 and device 10 may play this audio content for a user using speakers within device 10. Device 10 may also play audio content that has been stored locally within storage 20 in device 10.

Figure 2:
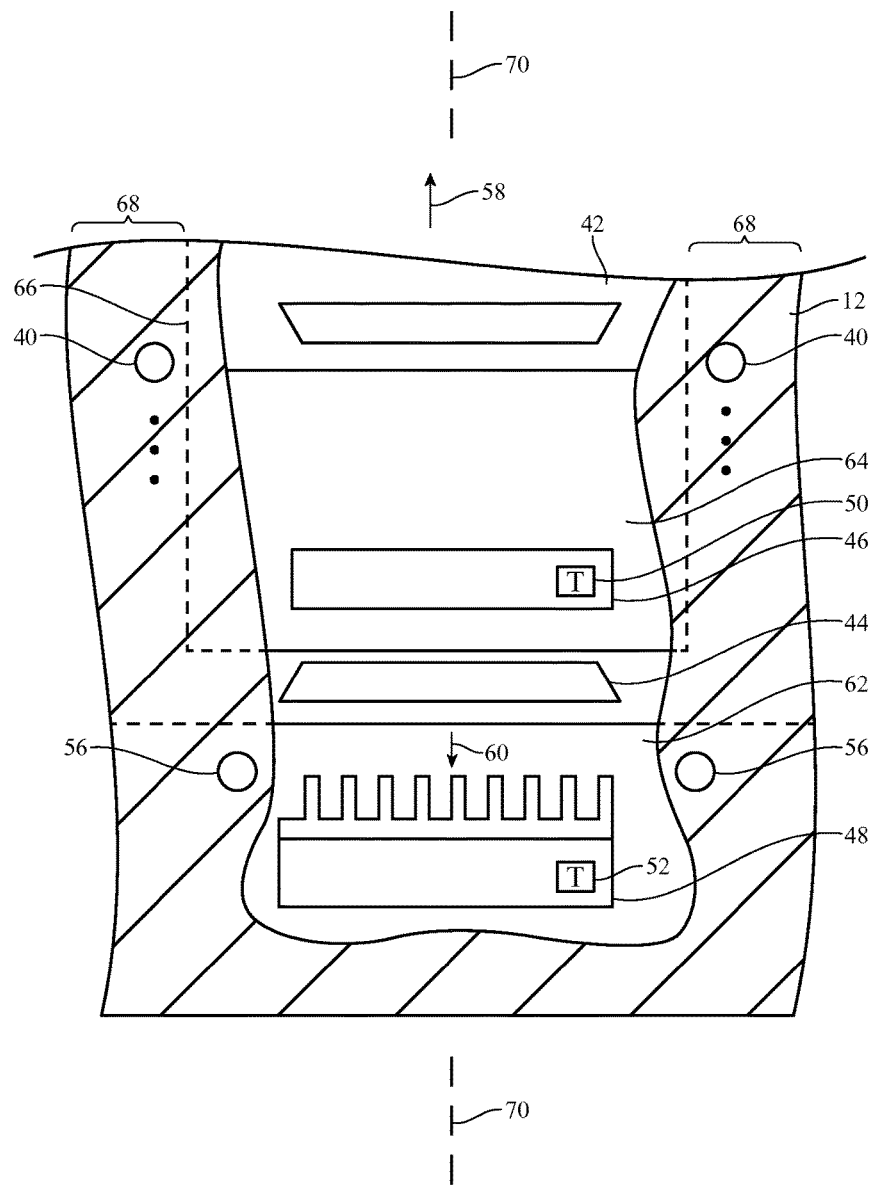
FIG. 2 is a partly cut-away side view of an illustrative electronic device in accordance with an embodiment.

A partly cut-away side view of an illustrative electronic device is shown in FIG. 2. As shown in FIG. 2, device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Device 10 may have inner housing structures that provide additional structural support to device 10 and/or that serve as mounting platforms for printed circuits and other structures. Structural internal housing members may sometimes be referred to as housing structures and may be considered to form part of housing 12.

Housing 12 may have a shape with planar sides, curved sides, or combinations of planar and curved sides. As an example, housing 12 may be cylindrical and may have a cylindrical wall that surrounds axis 70 or may have a box-shape having four sides with four corresponding planar walls. Housing walls of other shapes may also be used (e.g., spherical shapes, pyramidal shapes, etc.). Housing 12 may have an elongated shape that extends along axis 70 (i.e., axis 70 may serve as the longitudinal axis for device 10 as well as the central axis of a cylindrical housing) or may have a non-elongated shape.

The housing wall for housing 12 may have openings that receive one or more components such as components 40. Components 40 may be light-based components (e.g., light-emitting diodes, displays, lamps, light-based status indicator components, light-based proximity sensors, etc.), sensors (e.g., ambient light sensors, capacitive proximity sensors, touch sensors, force sensors, microphones and other audio sensors), speakers (e.g., tweeters, mid-range drivers, other middle-to-high frequency speakers, woofers, etc.), or other suitable components. There may be any suitable number of components 40 in device 10 (e.g., one or more, two or more, five or more, ten or more, 50 or more, 10-40, fewer than 100, more than 60, etc.). Components 40 may be mounted in the upper portion of device (e.g., in an array of rows and columns that wraps around the exterior of device 10) or may be mounted in other portions of device 10. The configuration of FIG. 2 is merely illustrative.

It may be desirable to provide device 10 with the capability to reproduce low-frequency sounds. Accordingly, device 10 may be provided with one or more subwoofers such as subwoofers 42 and 44 or other speakers capable of producing low-frequency sounds (e.g., sounds below 40 Hz, below 35 Hz, from 20-50 Hz, above 15 Hz, etc.). Subwoofer 42 may, for example, be oriented upwards to produce sound in direction 58, whereas subwoofer 44 may be oriented downwards to produce sound in direction 60. Arrangements with fewer than two subwoofers or more than two subwoofers may also be used.

To prevent interference between subwoofers such as subwoofers 42 and 44 and components 40, it may be desirable to provide device 10 with an isolation wall such as inner wall 66 between components 40 and subwoofers 42 and 44. Inner wall 66 may, as an example be a hollow tube or other cylindrical wall. The presence of inner wall 66 within housing 12 may create an annular cavity such as cavity 68 between the exterior surface of wall 66 and the opposing interior surface of the wall of housing 12. Cavity 68 may be exposed to the rear portions of components 40. Wall 66 serves to separate annular cavity 68 from interior cavity 64. The rears of subwoofers 42 and 44 are exposed to cavity 64, so cavity 64 may sometimes be referred to as the back volume of subwoofers 42 and 44 (i.e., the subwoofer back volume of device 10). Cavity 64 may have a cylindrical shape, may have a box shape, may be a volume surrounded by planar and curved sides, etc. In configurations of the type shown in FIG. 2, there are no air passages between cavities 64 and 66, so cavities 64 and 66 are isolated from each other.

Subwoofer 42 is open to the air surrounding device 10 and can therefore radiate sound upward in direction 58. Subwoofer 44 faces in direction 60 and can therefore radiate sound downward in direction 60 into cavity 62. The sound produced by subwoofer 44 may exit cavity 62 into the air surrounding device 10 through openings 56 in housing 12. Due to the presence of openings 56 (i.e., openings that connect cavity 62 to outside ambient air), cavity 62 is not sealed, so air can flow into and out of cavity 62 (i.e., cavity 62 is vented).

Device 10 may include electrical components such as components 46 and 48. Components 46 and 48 may include integrated circuits, discrete components such as resistors, capacitors, and inductors, switches, electromechanical components, audio circuits such as amplifiers, digital-to-analog converters, and filters, power supply components such as transformers, digital signal processors, communications circuits, and other circuitry and components (see, e.g., circuitry 16 and devices 18 of FIG. 1). Components 46 and 48 may be mounted in any suitable location within device 10. As an example, component(s) 46 may be mounted in cavity 64 and component(s) 48 may be mounted in cavity 62. With one suitable arrangement, component 48 may be a power supply and component(s) 46 may be signal processing components for performing digital and/or analog processing operations on audio content (e.g., digital communications circuitry for receiving audio content from external equipment 10' and/or local sources, digital signal processing circuitry for processing received digital data, analog circuits such as audio signal amplifiers for driving signals into speakers in device 10 such as components 40 and speakers 42 and 44, or other suitable components). In general, components 46 and 48 may be any suitable electrical components in device 10. Configurations in which component(s) 46 is used in forming control circuitry 16 and in which component(s) 48 is a power supply are sometimes described herein as an example.

The components within device 10 may produce heat during operation. For example, power supply 48 may generate considerable amounts of heat, particularly when audio content is being played through the speakers of device 10. Subwoofers 42 and 44 can draw substantial power when bass-heavy content is being played. Heat production in device 10 can be monitored in real time using temperature sensors such as temperature sensor 50 in components 46, temperature sensor 52 in power supply 48, or other temperature sensors in device 10. Control circuitry 16 can gather real time temperature measurements and can take action to cool heat-producing components when a temperature rise of more than a predetermined amount is detected. Control circuitry 16 can also take action to cool heat-producing components based on estimates of current and future heat production obtained by analyzing audio data during audio playback operations.

To help cool a heat-producing electrical component such as power supply 48, power supply 48 may be mounted in the vicinity of a speaker in device 10 such as subwoofer 44 (i.e., under subwoofer 44 and within cavity 62 in the configuration of FIG. 2). During operation of subwoofer 44, the movement of the diaphragm of subwoofer 44 will cause air to flow over power supply 48 that cools power supply 48. In particular, when subwoofer 44 is driven downwards in direction 60, air will be pushed downwards in direction 60 and will flow past power supply 48. A heat sink structure such as heat sink 54 of FIG. 2 may be provided with fins or other structures that help convey heat away from power supply 48 when exposed to the airflow created by movement of subwoofer 44. Hot air may be expelled through openings 56 and cool air may be drawn into cavity 62 through openings 56 to facilitate cooling.

The location of power supply 48 adjacent to subwoofer 44 allows subwoofer 44 to cool power supply 48. In particular, cooling is enhanced by mounting power supply 48 in a position that allows airflow generated by subwoofer 44 to pass over heat sink 54 and other portions of power supply 48. When device 10 is being lightly used (e.g., when audio content with minimal bass content is being played or when no audio content is being played), subwoofer 44 may be at rest. When device 10 is being more heavily used (e.g., when audio content with more bass content is being played or when audio is being amplified to high volume levels), the amount of heat produced by power supply 48 may increase, while at the same time the amount of airflow (and therefore cooling) that is generated by subwoofer 44 may increase. The positioning of power supply 48 and subwoofer 44 adjacent to one another within device 10 therefore serves to provide cooling to power supply 48 when needed, even in the absence of additional optional thermal management operations.

Figure 3:
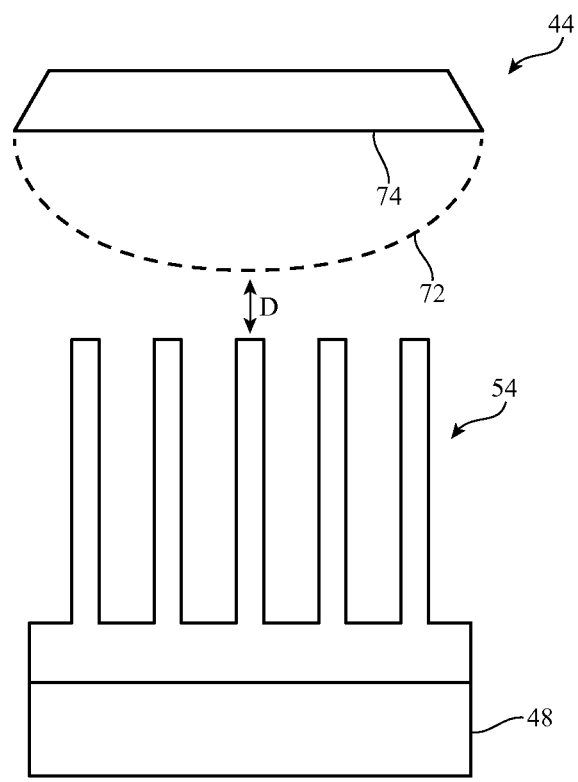
FIG. 3 is a diagram of an illustrative heat sink structure mounted adjacent to a speaker in accordance with an embodiment.

To enhance cooling from subwoofer 44, it may be desirable to place heat sink 54 in a location that is separated by a relatively small distance D from the position at which diaphragm 74 of subwoofer 44 reaches its maximum excursion (see, e.g., position 72 of FIG. 3). Distance D may be, for example, less than 50 cm, less than 25 cm, less than 10 cm, less than 5 cm, or less than 2 cm.

In addition to providing cooling to power supply 48 from the normal operation of subwoofer 44, control circuitry 16 in device 10 (see, e.g., components 46) may regulate the operation of subwoofers 42 and/or 44 to facilitate cooling. For example, control circuitry 16 may dynamically control subwoofer 44 to produce airflow that cools power supply 48. Dynamic control operations such as these may, as an example, be performed by monitoring and analyzing the audio content that is being played or that is to be played with the speakers of device 10. Digital content analysis can be performed by control circuitry 16 on digital audio data that is being stored in storage 20 of device 10. The digital audio data stored in storage 20 may include locally stored content (e.g., digital audio files) or may include streaming content that is being received from external device 10' (e.g., a portion of a digital audio file that has been received and buffered in storage 20 in advance of being played on device 10). Because digital information on the content to be played on device 10 is available in advance of playback, control circuitry 16 can analyze future content. Device 10 may, for example, determine whether or not particular bass-heavy content or other heat-producing content is about to be played by device 10. Based on currently played content and/or based on future content, device 10 can control the operation of subwoofer 42 and/or subwoofer 44 to ensure that power supply 48 is adequately cooled.

If, for example, control circuitry 16 detects content that includes heavy bass content or other content that will result in increased heat production by power supply 48, device 10 can take appropriate action. Action can be taken either while the bass-heavy content is being played or in advance to prepare for the upcoming playback of the bass-heavy content. Action can also be taken while other content is being played (e.g., classical music with little or no bass) or in advance of playing back such content. Even when playing low-base content, the amount of heat being produced by power supply 48 may be sufficient to warrant cooling by subwoofer 44. By using control circuitry 16 to detect and/or predict the playback of this heat-producing content, subwoofer 44 can be activated to produce airflow and thereby cool power supply 48, even when subwoofer 44 would not otherwise be active or would not be sufficiently active to cool power supply 48 as much as desired.

To prevent subwoofer cooling operations from creating an audible disturbance (i.e., an audio signal that is not part of the audio content that is being played back), control circuitry 16 can drive subwoofer 44 at a low frequency such as a frequency below the normal range of human hearing. The lowest frequency at which humans are generally said to be able to hear audio signals is about 20 Hz. Accordingly, by driving subwoofer 44 at frequencies at or below 20 Hz, the amount of undesired acoustic signal that is produced by subwoofer 44 when it is being driven to create a cooling airflow can be minimized or avoided completely. For example, control circuitry 16 can drive subwoofer 44 at an inaudible frequency (e.g., a frequency below 20 Hz, below 10 Hz, from 5-20 Hz, above 4 Hz, or below 15 Hz) whenever digital signal analysis on the audio content that is being played or to be played indicates the power supply 48 will be producing excessive amounts of heat and will not be sufficiently cooled by normal movement of subwoofer 44. Subaudible (barely audible) signals such as low-volume signals at 40 Hz, 50 Hz, or other frequencies can also be used as cooling signals.

Insufficient cooling scenarios may arise either because subwoofer 44 would normally be inactive due to the lack of bass content in the audio signal or because subwoofer 44 would normally be only slightly active due to the presence of small amounts of bass content in the audio signal. In either case, control circuitry 16 can apply a subaudible signal (i.e., an inaudible signal or nearly inaudible signal) to subwoofer 44 (e.g., a signal below 20 Hz) so that the amount of airflow from subwoofer 44 is increased sufficiently to provide desired cooling to power supply 48.

Figure 4:
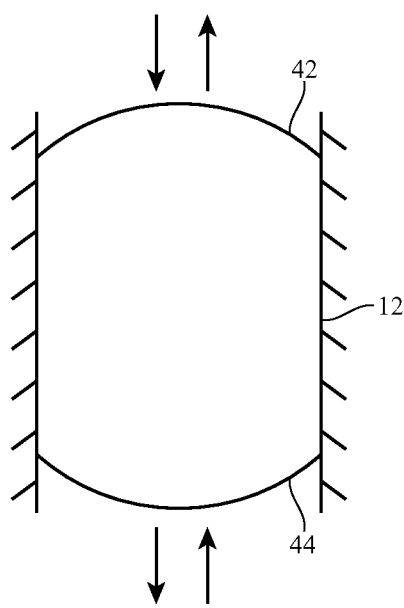
FIG. 4 is a diagram showing how an upper speaker and lower speaker may have diaphragms that move in opposing directions in accordance with an embodiment.
Figure 5:
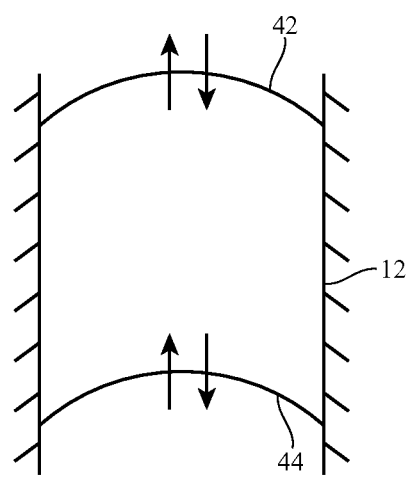
FIG. 5 is a diagram showing how an upper speaker and lower speaker may have diaphragms that move in tandem during cooling operations in accordance with an embodiment.

During normal movement of subwoofers 42 and 44 to play audio to a user, subwoofers 42 and 44 move in opposite directions, as shown in FIG. 4. For example, subwoofer 42 may move up while subwoofer 44 is moving down or subwoofer 42 may move downwards at the same time that subwoofer 44 is moving upwards. For enhanced efficiency in cooling power supply 48 (e.g., when a subaudible signal is being driven into subwoofer 42 and when little or no bass content is being played back using subwoofer 42), control circuitry 16 may drive subwoofers 42 and 44 in tandem (i.e., so that their diaphragms move in the same direction), as shown in FIG. 5. For example, subwoofers 42 and 44 may move up together and may move down together. This type of tandem motion consumes less energy than normal operations of the type shown in FIG. 4 and may therefore help reduce the load on subwoofers 42 and 44 and the resulting heat produced by power supply 48 by driving subwoofers 42 and 44 out of phase from each other as depicted in FIG. 5.

Figure 6:
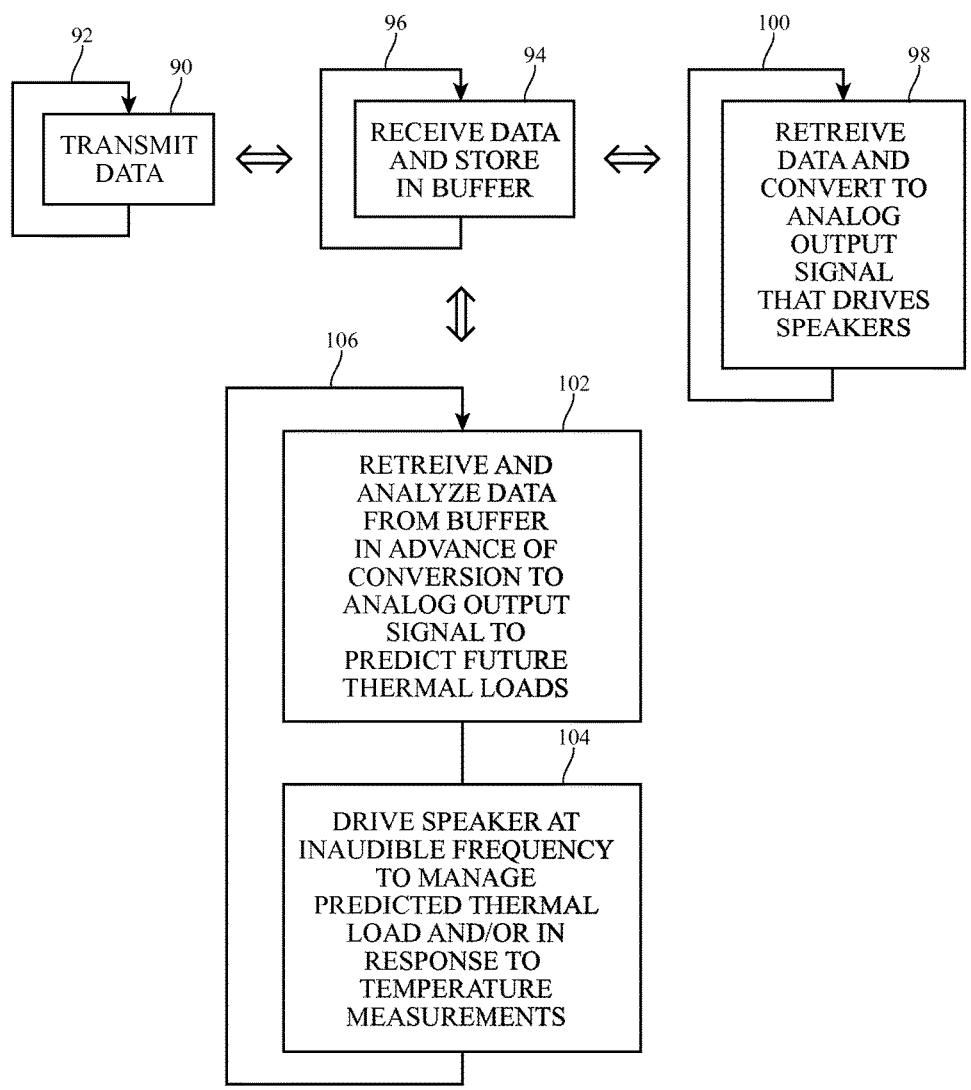
FIG. 6 is a flow chart of illustrative steps involved in operating an electronic device in accordance with an embodiment.

Illustrative steps involved in operating device 10 in a system such as system 8 of FIG. 1 or other operating environment are shown in FIG. 6. In scenarios in which device 10 is playing back audio content from local storage (e.g., an audio file stored in a hard drive, solid state memory, or other local storage media), control circuitry 16 can obtain the audio content to be played from storage 20 in device 10. In scenarios in which it is desired for device 10 to play back audio content that is provided from external device 10', device 10' may, at step 90, transmit (e.g., stream) the audio data to device 10 over network 24. Network 24 may be a wired or wireless connection between devices 10' and 10. As an example, network 24 may include a wired local area network, a peer-to-peer cable between devices 10' and 10, a wireless local area network, or other suitable communications path. The information that device 10' transmits to device 10 at step 90 may be audio content such as a song, audible book, radio station, a video with audio content, a telephone call, a video call with audio content, or other data that results in heating of power supply 48 or other circuitry in device 10. The transmission of the audio data or other data from device 10' to device 10 may take place continuously (see, e.g., line 92 of FIG. 6), may take place periodically, or may take place in response to satisfaction of predetermined criteria.

Audio content and other information that is transmitted during the operations of step 90 may be received by device 10 and stored in a buffer implemented in storage 20 on device 10 at step 94. The reception of the audio data from device 10' may take place continuously as content is being streamed, as illustrated by line 96. Data may also be received and stored for later playback, if desired.

As indicated by step 98 and line 100, control circuitry 16 may continuously retrieve audio data from the buffer in storage 20 and may play this audio through the speakers of device 10. For example, control circuitry 16 may use digital-to-analog converter circuitry to convert digital audio data into analog signals and may use audio amplifiers to amplify the audio signals. The amplified audio signals may be used to drive speakers 42, and 44 and other audio components (e.g., a speaker in components 40, speakers elsewhere in device 10, and/or other audio transducer components).

As the audio content is being buffered in storage 20 and played back at step 98, control circuitry 16 may retrieve and analyze some or all of the buffered data (step 102). The analysis operations may take place on the audio data that is currently being played through the speakers of device 10 and/or or may take place on data (i.e., future data) that has been retrieved for analysis but which has not yet been converted to analog signals and played for the user.

In some situations, audio signal analysis during the operations of step 102 will reveal that bass content is present (or will shortly be present) in the audio being played, so control circuitry 16 can conclude that subwoofer 44 will be in motion. Nevertheless, the analysis of the audio signal may also reveal that the movement expected of subwoofer 44 due to the anticipated motion will be insufficient to cool power supply 48 as much as desired. This may occur, for example, when the audio content being played back is sufficient to create a heat rise, but contains relatively little bass content. When control circuitry 16 detects that this type of scenario has arisen or is about to arise, control circuitry 16 can drive subwoofer 44 with subaudible signals (e.g., signals at inaudible frequencies or nearly inaudible signals) to supplement the movement of subwoofer 44 (step 104). To avoid interference with bass content being played by device 10, bass content can be routed to subwoofer 42 (e.g., while subaudible cooling signals are being provided to subwoofer 44) or bass playback can be momentarily suspended. If desired, control circuitry 16 may supply the subaudible (e.g., inaudible or nearly inaudible) drive signals to subwoofers 42 and 44 and may drive subwoofers 42 and 44 in a tandem configuration (diaphragms moving in the same direction in unison) to enhance efficiency, as described in connection with FIG. 5. Control circuitry 16 can also drive subwoofer 44 (and/or subwoofer 44) with subaudible signals to produce cooling airflow in response to detection of temperature measurements from temperature sensors such as sensors 50 and 52 that indicate that the temperature within device 10 is becoming too high. In general, control operations to cool power supply 48 may be performed based on temperature measurements, based on a predetermined schedule, based on analysis of audio data, based on user commands or commands from external device 10', or based on any other criteria. Actions that may be taken in response include rerouting bass content or other heat-producing content to appropriate subwoofers or other speakers within device 10, temporarily suppressing bass content or other heat-producing content, providing subwoofers 42 and/or 44 with subaudible drive signals to produce cooling airflow, etc. As shown by line 106, processing may then loop back to step 102, so that additional audio data can be processed.

If desired, device 10 may be provided with airflow biasing structures that help establish a desired air flow pattern within device 10 during movement of speakers (e.g., during subwoofer diaphragm movement or movement of other speaker diaphragms) to promote cooling.

Figure 7:
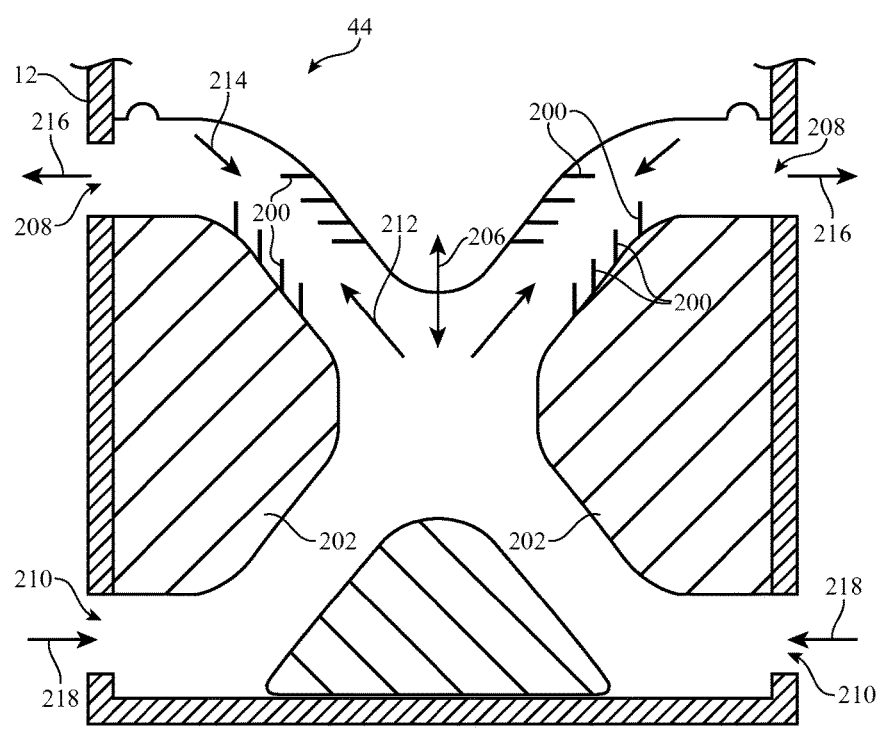
FIG. 7 is a cross-sectional side view of a portion of an illustrative electronic device with airflow biasing structures in accordance with an embodiment.

Consider, as an example, the arrangement of illustrative device 10 that is shown in the cross-sectional side view of FIG. 7. As shown in FIG. 7, speaker (speaker diaphragm) 44 and portions of opposing structure 202 (e.g., internal device structures, portions of housing 12, etc.) may be provided with airflow biasing features such as airflow biasing structures 200. Structures 200 may be fins or other protruding members, protrusions with sloped surfaces, structures with asymmetric curved surfaces, or any other structures that promote asymmetric movement of air within device 10 in response to reciprocation of speaker 44 in directions 206.

Housing 12 may have passageways that serve as one or more entrances and one or more exits for air. In the illustrative arrangement of FIG. 7, housing 12 has openings such as openings 210 that serve as airflow entrances and openings such as openings 208 that serve as airflow exits (e.g., exhausts for air that has become heated by internal device components). During operation of speaker 44, speaker 44 moves back and forth in directions 206. Due to the angled shapes or other airflow biasing shapes of airflow biasing structures 202, movement of speaker 44 causes more air to flow in direction 212 on average than in direction 214. As a result, a flow of air is established through device 10 that cools the internal components of device 10 (i.e., cool air is drawn into the interior of housing 12 in directions 218 through entrances 210 and hot air is forced out of housing 12 in directions 216 through exits 208.

Figure 8:
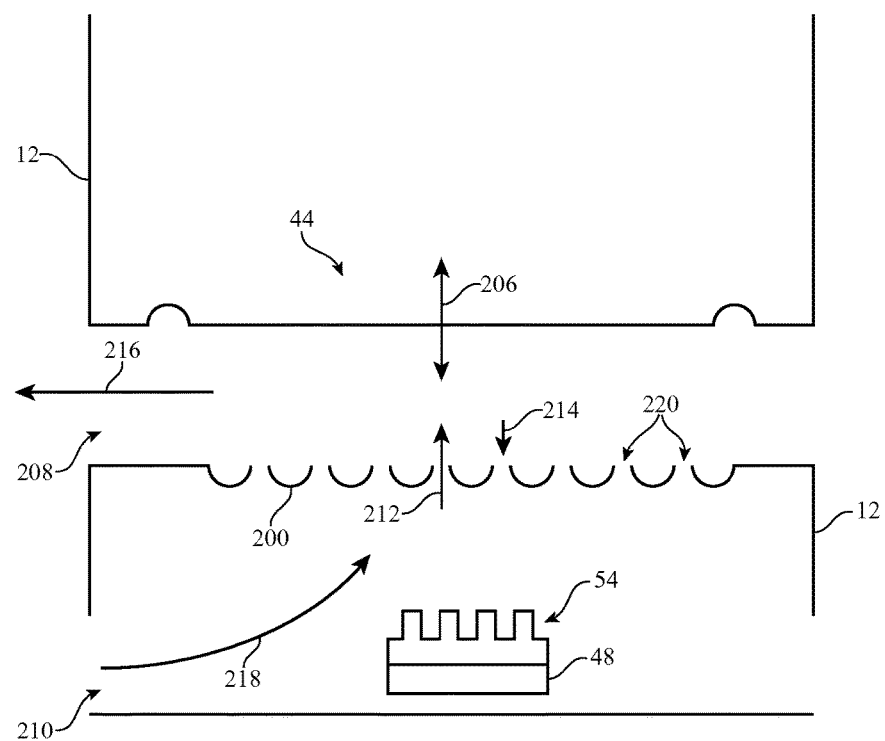
FIG. 8 is a cross-sectional side view of a portion of another illustrative electronic device with airflow biasing structures in accordance with an embodiment.

In the illustrative example of FIG. 8, airflow biasing structures 200 have a shape that forms an array of openings 220 between an upper portion of the interior of housing 12 and a lower portion of the interior of housing 12 that contains component 48 and heat sink 54. The asymmetric shape of structures 200 (which have convex surfaces that protrude downwards in the configuration of FIG. 8) causes air to flow more through openings 220 in upwards direction 212 than in downwards direction 214, thereby establishing a flow of cool air 218 through entrance 210 and hot air 216 through exit 208.

Figure 9:
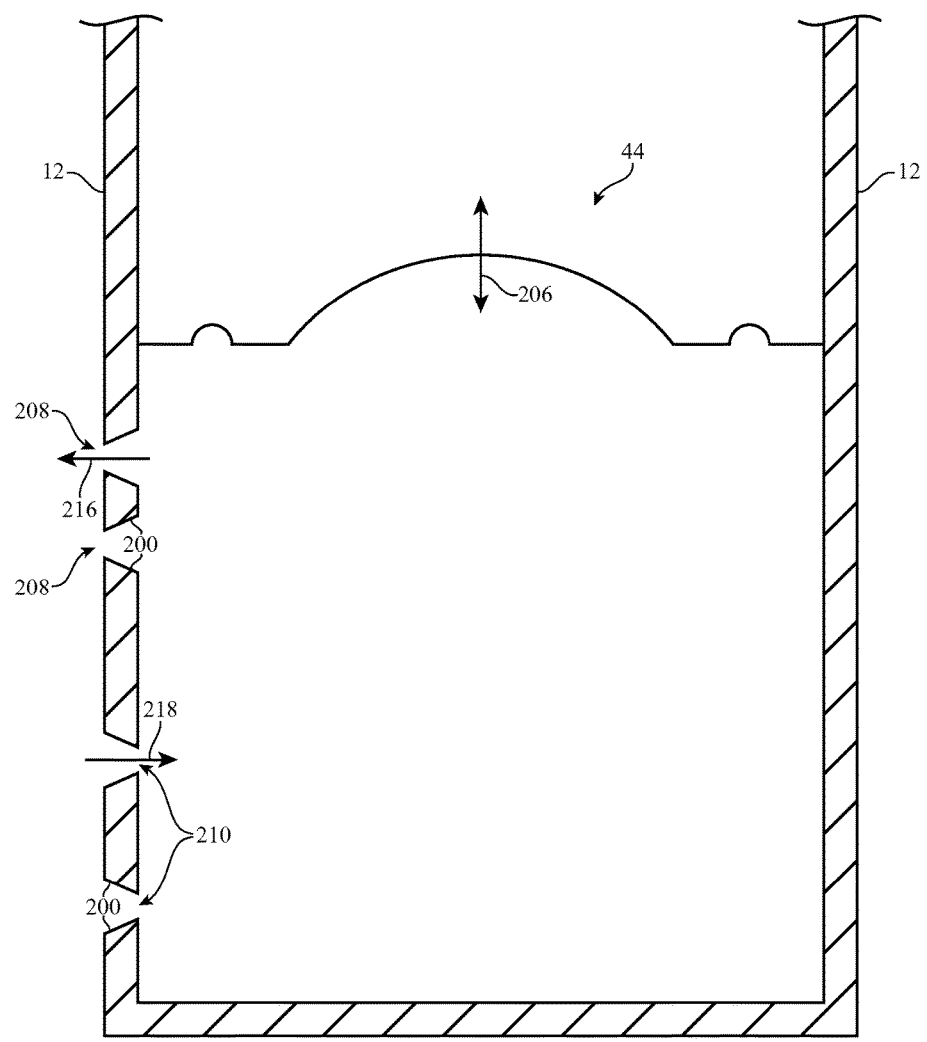
FIG. 9 is a cross-sectional side view of a portion of an electronic device with airflow biasing structures of the type that may be formed from shaped passageways through a housing wall or other structure in accordance with an embodiment.

The cross-sectional side view of the electronic device of FIG. 9 shows how openings in housing 12 such as entrances 210 and exits 208 may have sloped sidewall surfaces that form airflow biasing structures 200 that cause air to preferentially flow inwardly (as with entrances 210) or outwardly (as with exits 208). The illustrative airflow biasing structures of FIG. 9 may be formed on housing 12 or on internal device structures that cover openings in housing 12.

Figure 10:
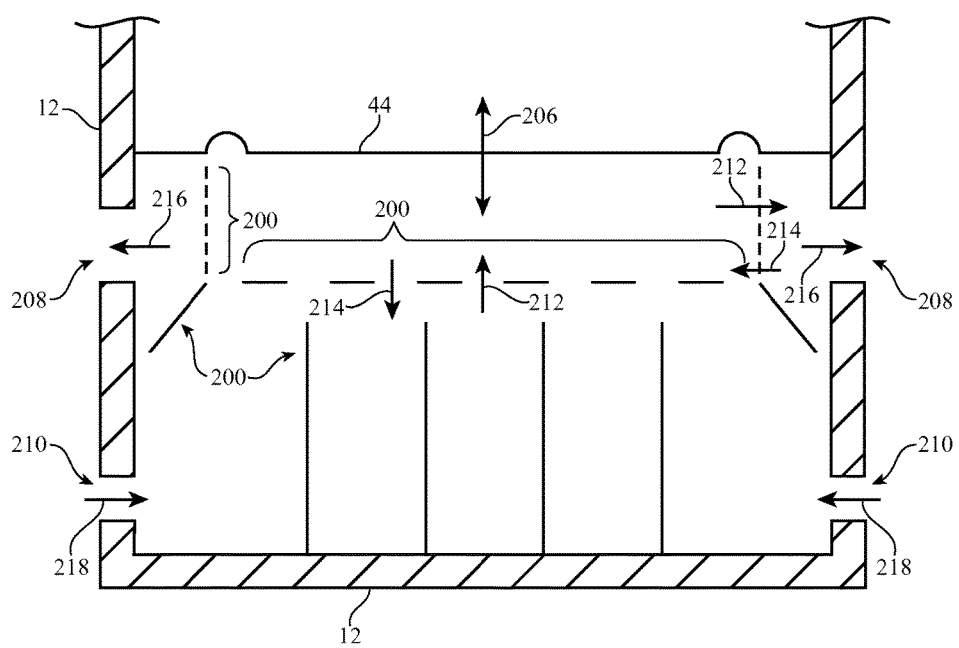
FIG. 10 is a cross-sectional side view of an illustrative electronic device with additional airflow biasing structures in accordance with an embodiment.

FIG. 10 shows an illustrative configuration in which airflow biasing structures 200 are formed under speaker 44. Structures 200 may have shapes that promote more airflow in directions 212 than in directions 214, thereby causing cool air 218 to enter housing 12 through entrances 210 and corresponding heated air 216 to exit housing 12 through exits 208.

Figure 11:
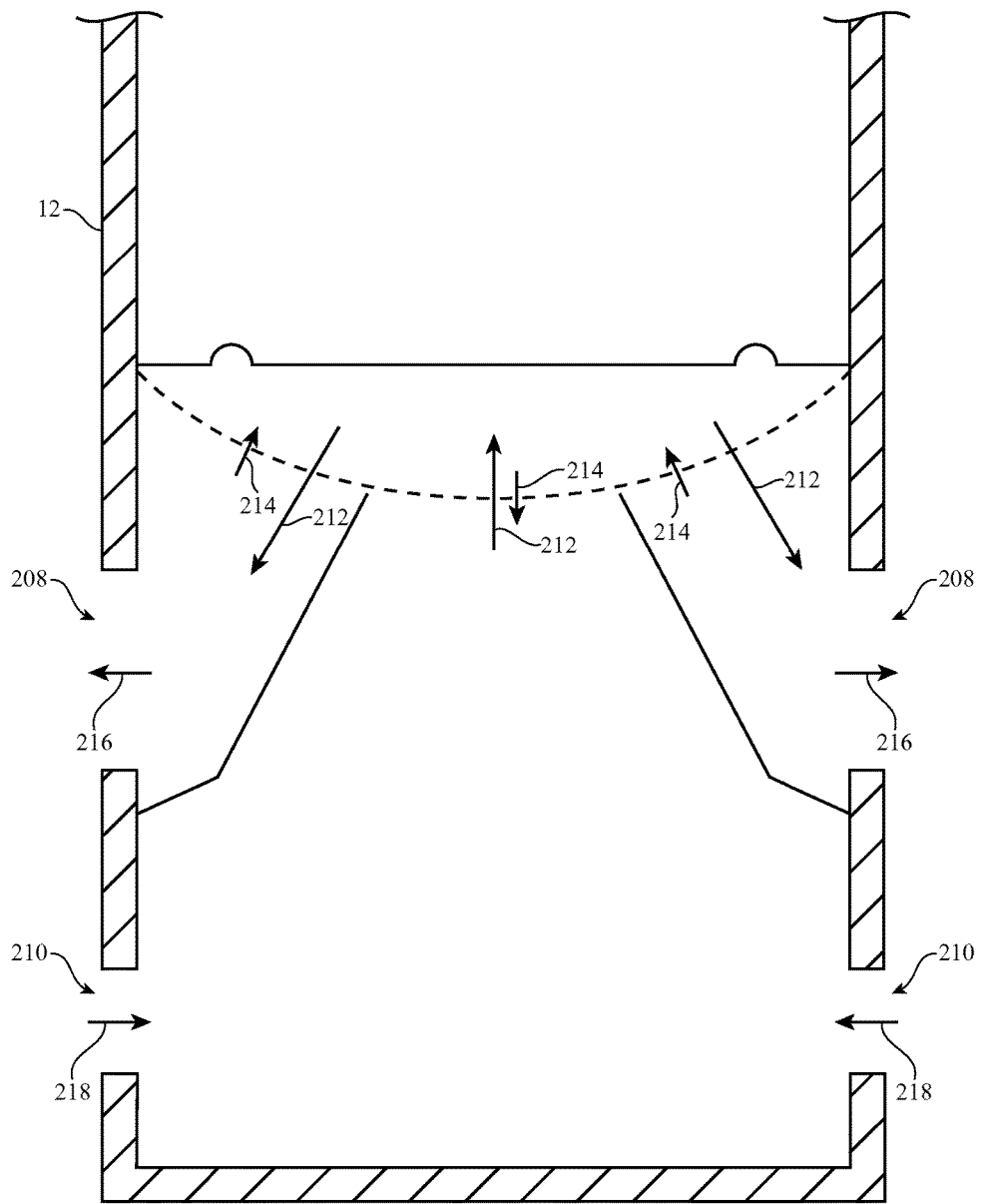
FIG. 11 is a cross-sectional side view of an illustrative electronic device with airflow biasing structures that encourage air to flow into and out of respective airflow entrances and airflow exits in a housing in accordance with an embodiment.

Another illustrative airflow biasing configuration for device 10 is shown in FIG. 11. As shown in FIG. 11, airflow biasing structures 200 have a curved shape that causes more air to flow upwards and outwards in directions 214 than downwards and inwards in directions 212. As a result, airflow is established through housing 12 in which cool air 218 enters housing 12 through entrances 210 and hot air 216 exits housing 12 through exits 208.

Figure 12:
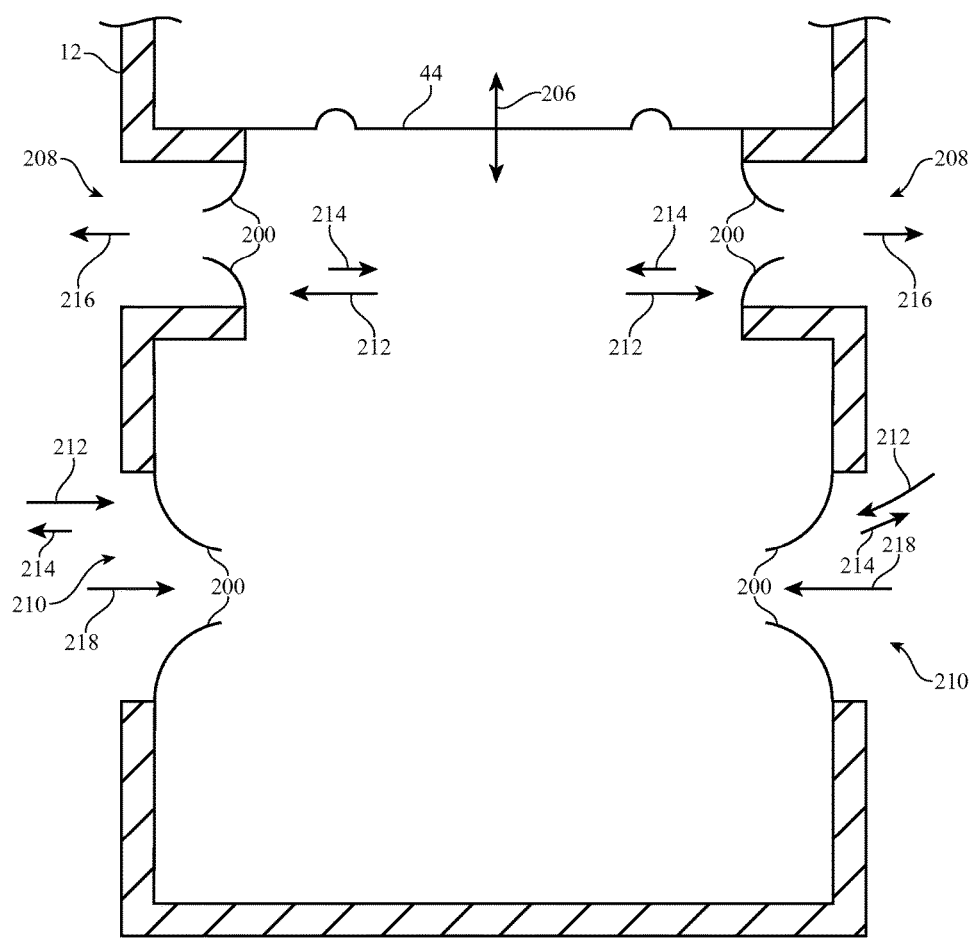
FIG. 12 is cross-sectional side view of an illustrative electronic device with flexible airflow biasing structures in accordance with an embodiment.

If desired, flexible structures such as one or more layers of flexible fabric, flexible layers of plastic, or other flexible members may be configured to serve as airflow biasing structures 200. This type of arrangement is shown in FIG. 12. In the example of FIG. 12, airflow biasing structures 200 have been formed from inwardly slanting and outwardly slanting flexible layers that serve as one-way air flow valves for the openings in housing 12. Structures 200 have orientations that promote more air flow in directions 212 than in directions 214, so that cool air 218 enters housing 12 through entrances 210 and hot air 216 is expelled from housing 12 through exits 208 due to motion of speaker 44 in directions 206.

Figure 13:
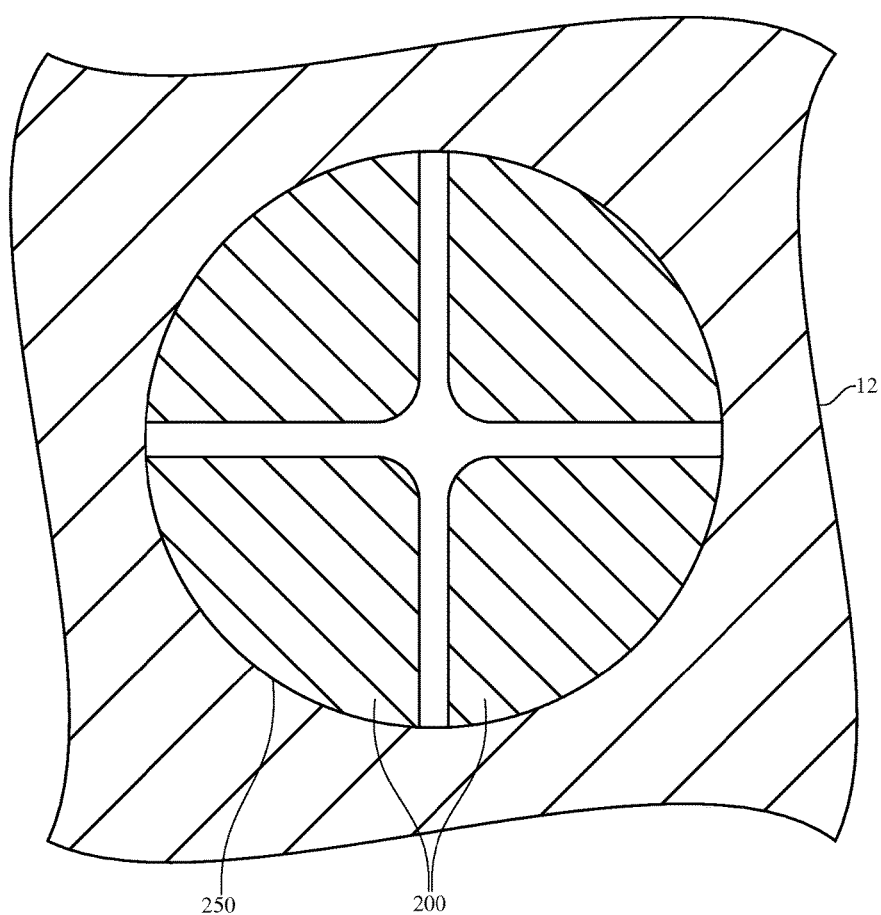
FIG. 13 is a side view of a passageway in an electronic device that has been provided with flexible airflow biasing structures in accordance with an embodiment.

FIG. 13 is a side view of a portion of housing 12 having an opening 250 (i.e., an exit or entrance opening) that is covered with flexible panels of fabric, plastic, or other layers of flexible material that serve as airflow biasing structures. In the example of FIG. 13, opening 250 has a circular shape and there are four corresponding flexible panels in airflow biasing structures 200, each of which covers a respective quadrant of opening 250. More panels or fewer panels may be used to cover an opening. The use of four panels in the example of FIG. 13 is merely illustrative. If desired, flexible airflow biasing structures may be used in connection with arrangements of the type shown in FIGS. 7, 8, 9, 10, and 11.

The illustrative airflow biasing structures 200 that are shown in FIGS. 7, 8, 9 10 11, may be used with speakers that are moved to help promote cooling of power supplies and other components in device 10 and may be used while speakers are moved in tandem and/or are controlled based on analysis of upcoming audio content as described in connection with FIGS. 1, 2, 3, 4, 5, and 6.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
a housing defining a first opening and a second opening separate and distinct from the first opening;
an electrical component in the housing that produces heat;
a subwoofer comprising:
a diaphragm, and
airflow biasing structures protruding from and distributed across a surface of the diaphragm; and
control circuitry configured to drive the diaphragm to generate a flow of air through the housing, the airflow biasing structures of the subwoofer helping to establish a direction of the flow of air through the housing that enters the housing through the first opening and exits the housing through the second opening.

2. The electronic device defined in claim 1 wherein the control circuitry supplies subaudible drive signals to the subwoofer to produce the flow of air that cools the electrical component.

3. The electronic device defined in claim 1 wherein the airflow biasing structures protrude from the diaphragm in an orientation that impedes air within the housing from flowing the second opening toward the first opening.

4. The electronic device defined in claim 3 wherein the housing comprises a cylindrical housing having a first cavity to which the electrical component is exposed and a second cavity that forms a back volume for the subwoofer.

5. The electronic device defined in claim 1 wherein the airflow biasing structures are a first plurality of airflow biasing structures and the electronic device further comprises a second plurality of airflow biasing structures protruding from an interior surface of the housing, the interior surface positioned proximate the diaphragm.

6. The electronic device defined in claim 1 wherein adjacent ones of the airflow biasing structures are substantially parallel.

7. The electronic device defined in claim 1 wherein the flow of air passes through a cavity defined by the housing, the first and second openings being disposed on different ends of the cavity.

8. The electronic device defined in claim 7, further comprising a heat emitting component disposed within the cavity, wherein the flow of air cools the heat emitting component.

9. The electronic device defined in claim 2 further comprising a temperature sensor and wherein the control circuitry supplies the subaudible drive signals in response to measurements from the temperature sensor.

10. The electronic device defined in claim 1 wherein the airflow biasing structures protrude from the diaphragm into a channel terminating at the second opening.

11. The electronic device defined in claim 1 wherein the airflow biasing structures include flexible structures.

12. The electronic device defined in claim 11 wherein the flexible structures include flexible structures selected from the group consisting of: flexible layers of fabric and flexible layers of plastic.

13. The electronic device defined in claim 1 wherein the airflow biasing structures include sloped sidewall surfaces on at least a selected one of the first opening and the second opening.

14. An apparatus, comprising:
a housing;
a speaker mounted in the housing that produces airflow during operation of the apparatus and having a diaphragm that extends across an interior cavity defined by the housing to divide the interior cavity into a first volume of air and a second volume of air;
a heat-producing electrical component that is mounted within the first volume of air and that is cooled by the airflow; and
airflow biasing structures protruding from the diaphragm and into the first volume of air, the airflow biasing structures assisting in guiding the airflow produced by the speaker into the first volume through a first opening defined by the housing and then out of the first volume through a second opening defined by the housing, wherein the second opening is different than the first opening and the airflow biasing structures protrude from the diaphragm in an orientation that impedes air within the housing from flowing from the second opening toward the first opening.

15. The apparatus defined in claim 14 further comprising:
control circuitry that drives the speaker with a subaudible signal to help produce the airflow and enhance cooling of the heat-producing electrical component with the airflow.

16. The apparatus defined in claim 15 wherein the control circuitry analyzes audio content that is to be played through the speaker and produces the subaudible signal in response to predicting future heat production by the heat-producing electrical component from analyzing the audio content.

17. The apparatus defined in claim 16 wherein the first and second openings are disposed on different ends of the first volume of air.

18. The apparatus defined in claim 14 wherein the airflow biasing structures are configured to oscillate with the diaphragm.

19. The apparatus defined in claim 18 wherein the heat-producing electrical component comprises a power supply.

20. The apparatus defined in claim 14 wherein the housing has a plurality of openings in which electrical components are mounted.

21. The apparatus defined in claim 14 wherein the housing has at least one air entrance opening and at least one air exit opening and wherein the airflow biasing structures cause more of the airflow to enter the air entrance opening and exit the air exit opening than enters the air exit opening and exits the air entrance opening.

22. The apparatus defined in claim 21 wherein the airflow biasing structures include at least one flexible member.

23. A speaker, comprising:
a housing;
a subwoofer within an interior cavity of the housing, the subwoofer comprising a diaphragm;
a power supply disposed within the interior cavity of the housing that is cooled by airflow from the subwoofer; and
airflow biasing structures protruding from and distributed across a surface of the diaphragm, the airflow biasing structure helping to guide an airflow generated by the subwoofer into the interior cavity through a first opening of the housing and then out of the interior cavity through a second opening of the housing.

24. The speaker defined in claim 23 further comprising:
wireless communications circuitry that receives digital audio data; and
control circuitry that predicts future heat production by the power supply based on analysis of the received digital audio data and that controls the subwoofer based at least partly on the predicted future heat production.

25. The speaker defined in claim 24, further comprising:
a temperature sensor,
wherein the control circuitry controls the subwoofer based at least partly on temperature measurements from the temperature sensor.

26. The speaker defined in claim 23 wherein the airflow biasing structures impede air from flowing from the second opening and toward the first opening.

* * * * *

UNITED STATES PATENT AND TRADEMARK OFFICE
CERTIFICATE OF CORRECTION

PATENT NO.         : 10,045,461 B1
APPLICATION NO.    : 14/720169
DATED              : August 7, 2018
INVENTOR(S)        : Brad G. Boozer et al.

Page 1 of 1

It is certified that error appears in the above-identified patent and that said Letters Patent is hereby corrected as shown below:

Column 11, Line 62, Claim 3:
Please insert --from-- after the word flowing.

Signed and Sealed this
Eighteenth Day of September, 2018

Andrei Iancu
*Director of the United States Patent and Trademark Office*